US008856701B1

(12) United States Patent
Chen et al.

(10) Patent No.: US 8,856,701 B1
(45) Date of Patent: Oct. 7, 2014

(54) METHOD OF RADIO-FREQUENCY AND MICROWAVE DEVICE GENERATION

(71) Applicant: Taiwan Semiconductor Manufacturing Co. Ltd, Hsin-Chu (TW)

(72) Inventors: Chin-Sheng Chen, Taoyuan (TW); Tsun-Yu Yang, Changhua (TW); Wei-Yi Hu, Zhubei (TW); Tao Wen Chung, San Jose, CA (US); Hui Yu Lee, Hsin-Chu (TW); Jui-Feng Kuan, Zhubei (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/795,220

(22) Filed: Mar. 12, 2013

(51) Int. Cl.
*G06F 17/50* (2006.01)
*G06F 9/45* (2006.01)

(52) U.S. Cl.
CPC .................................. *G06F 17/5045* (2013.01)
USPC ............................ 716/102; 716/103; 716/119

(58) Field of Classification Search
None
See application file for complete search history.

(56) References Cited

U.S. PATENT DOCUMENTS

| | | | | |
|---|---|---|---|---|
| 5,384,710 A | * | 1/1995 | Lam et al. ...................... | 716/102 |
| 5,717,928 A | * | 2/1998 | Campmas et al. ............ | 716/104 |
| 6,272,668 B1 | * | 8/2001 | Teene ............................. | 716/113 |
| 6,539,520 B1 | * | 3/2003 | Tiong et al. .................... | 716/102 |
| 7,269,809 B2 | * | 9/2007 | Shastri et al. ................. | 716/104 |
| 7,937,678 B2 | * | 5/2011 | Lippmann et al. ............ | 716/103 |
| 7,941,776 B2 | * | 5/2011 | Majumder et al. ............ | 716/122 |
| 8,176,445 B1 | * | 5/2012 | Qian ............................... | 716/52 |
| 2003/0069722 A1 | * | 4/2003 | Beattie et al. .................. | 703/14 |
| 2005/0289490 A1 | * | 12/2005 | Shastri et al. ..................... | 716/4 |
| 2008/0028353 A1 | * | 1/2008 | Lu et al. .......................... | 716/13 |
| 2009/0313596 A1 | * | 12/2009 | Lippmann et al. .............. | 716/12 |
| 2011/0078645 A1 | * | 3/2011 | Nakaya .......................... | 716/111 |
| 2012/0053923 A1 | * | 3/2012 | Li et al. ............................ | 703/14 |

* cited by examiner

*Primary Examiner* — A. M. Thompson
(74) *Attorney, Agent, or Firm* — Eschweiler & Associates, LLC

(57) ABSTRACT

The present disclosure relates to an apparatus and method to generate a device library, along with layout versus schematic (LVS) and parasitic extraction set-up files for connecting with official tools of a design window supported by a process design kit (PDK). The device library comprises passive devices which can be utilized at any point in an end-to-end design flow from pre-layout verification to post-layout verification of an integrated circuit design. The device library allows for a single schematic view for pre-layout verification but also post-layout verification, thus allowing for pole or pin comparison, and prevents double-counting of parasitic effects from passive design elements by directly instantiating a device from the device library for a verification step. An LVS and parasitic extraction graphical user interface (GUI) allows for incorporation of the generated device library into a pre-existing PDK without any modification to the PDK. Other devices and methods are also disclosed.

15 Claims, 5 Drawing Sheets

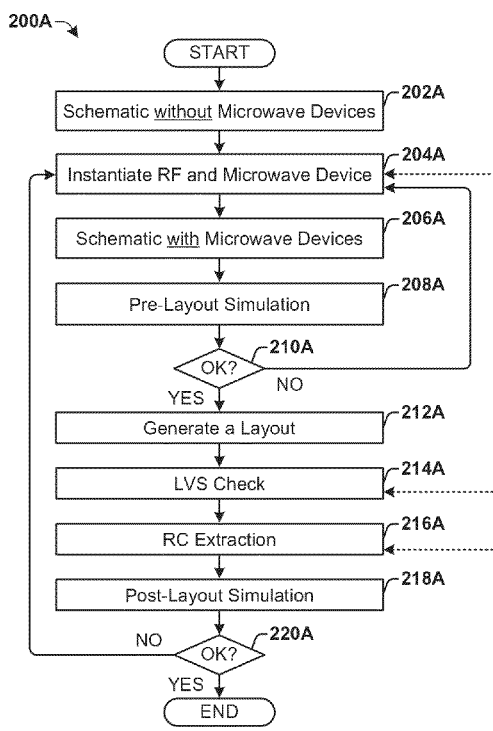
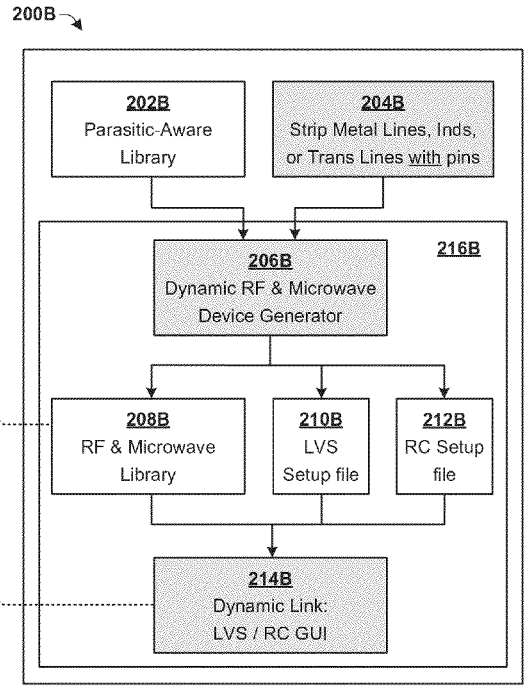
Fig. 2A                    Fig. 2B

US 8,856,701 B1

METHOD OF RADIO-FREQUENCY AND MICROWAVE DEVICE GENERATION

BACKGROUND

An end-to-end design flow of an integrated circuit includes schematic construction and pre-layout simulation, layout generation based upon the schematic, and post-layout simulation of the generated layout prior to manufacturing. Pre-layout simulation and post-layout simulation verify consistency of an integrated circuit between the schematic representation and the layout representation, respectively. Parameters which account for parasitic effects in the pre-layout simulation step are removed prior to layout generation to avoid double-counting of the parasitic effects in the post-layout simulation step. These parameters are derived directly from layout topologies within the layout representation.

BRIEF DESCRIPTION OF THE DRAWINGS

FIGS. 2A-2B illustrate some embodiments incorporation of passive device library elements into an integrated circuit design flow.

DETAILED DESCRIPTION

Figure 1:
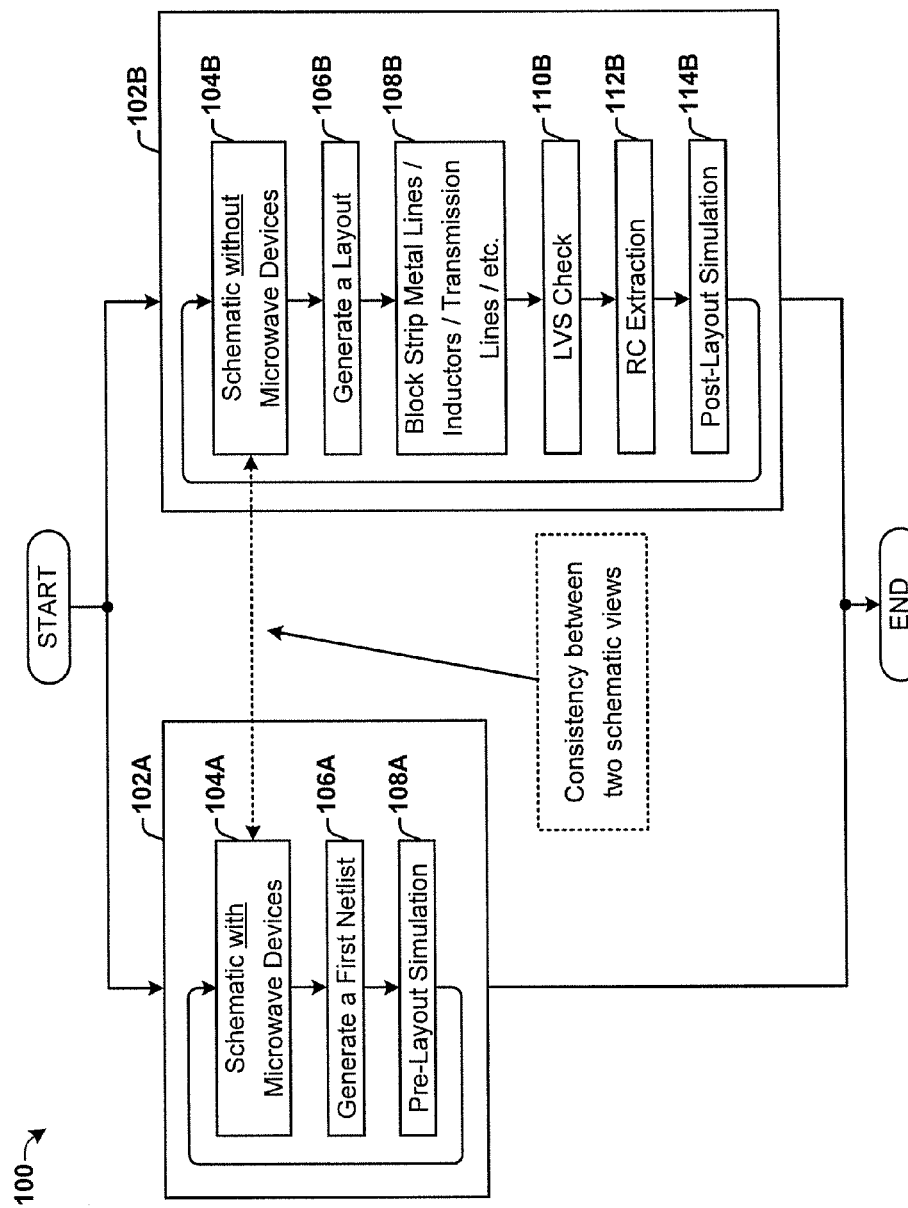
FIG. 1 illustrates an exemplary integrated circuit design flow comprising a pre-layout verification step and a post-layout verification step.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It may be evident, however, that one or more aspects described herein may be practiced with a lesser degree of these specific details. In other instances, known structures and devices are shown in block diagram form to facilitate understanding.

FIG. 1 illustrates an exemplary integrated circuit design flow 100 comprising a pre-layout verification step 102A and a post-layout verification step 102B. The pre-layout verification step 102A comprises construction of a first schematic representation of an integrated circuit (IC) at 104A in a schematic design tool such as a CADENCE VIRTUOSO or MENTOR GRAPHICS design window, generation of a pre-layout netlist describing the connectivity of electrical paths within the first schematic representation at 106A within the design window, and simulation of the electrical behavior of the first schematic representation at 108A with an industry-standard circuit simulation tool such as SPICE or SPECTRE within the design window. For a first schematic representation comprising radio-frequency (RF) or microwave devices, passive elements such as inductors, transmission lines, or metal strip lines are labeled with passive parameters for use in the simulation of the electrical behavior. Some passive parameters comprise scattering parameters (S-parameters) or a Lump-Model. These passive parameters are extracted by the circuit simulation tool from the schematic representation to produce a model of the circuit, which is simulated as a function of various input variables (e.g., clock frequency, voltage, etc.)

Upon successful completion of the pre-layout verification step 102A, the post-layout verification step 102B is performed, where a second schematic view of the IC is constructed at 104B. The second schematic view of the IC does not contain the passive elements as represented in the first schematic view. At 106B a layout representation corresponding to the schematic representation is generated, whereupon circuit components are formed with physical shapes such as physical design layers (e.g., gate polysilicon, metallization planes, etc.) for manufacturing. The passive parameters are removed from the second schematic view, and formed instead on the physical design layers in the layout generation step at 106B, where upon completion a layout designer must manually block strip metal lines, inductors, or transmission lines within the RF or microwave devices with specific layers allocated within a design layer assignment file (i.e., a technology layer file, or "techfile") provided by process design kits (PDKs). The PDKs comprise a consistent set of tools configured to create designs for a given technology node (e.g., Node-28 or Node-20) within the design window (e.g., a device and circuit symbol library, layout versus schematic checking, design rule checking for layouts, parameterized layout cells, etc.). The manual blocking allows for recognition of these layers as corresponding to passive devices. The passive parameters previously accounted for in the pre-layout verification step 102A by the subsequently-removed passive elements in the first schematic view are derived instead from the layout topologies within the blocked layers within the layout representation. Thus, removal of the passive elements prevents double counting of the parasitic effects in the post-layout simulation step 114B, where text layers containing the passive parameters are preserved from the schematic view, and recognized in post-layout simulation at 114B in the absence of suppression.

At 110B a layout versus schematic verification (LVS) step is performed to determine whether the layout representation of the IC corresponds to the second schematic representation of the IC. LVS checking software recognizes the drawn layout shapes (e.g., metallization shapes, via interconnects, etc.) of the layout representation that correspond to the electrical components of the IC (e.g., wires, pins, etc.), and generates a post-layout netlist, which is compared by the LVS software such as CALIBRE, QUARTZ, or HERCULES to the pre-layout netlist to verify correspondence. Note that passive electromagnetic effects such as transconductance depend upon electromagnetic field vectors. LVS does not account for this type of polarization.

At 112B parasitic extraction is performed to quantify passive parameters describing the electrical behavior from a top view of the layout representation of the design, which calculates parasitic effects from devices and wiring to create an accurate model of the IC. The post-layout simulation 114B utilizes the extracted layout view in place of the first schematic or second schematic view to emulate actual digital and analog circuit responses within the IC. The extracted layout view is used to simulate physical circuit. The post-layout simulation step is essentially identical to the pre-layout simulation in 108A, but with greater accuracy. The result of the post-layout simulation 114B should closely match the result of the pre-layout simulation 108A, where differences result from parasitic effects within the layout topologies within the layout representation (e.g., capacitive coupling between metallization planes, inductive coupling between passive devices, etc.) that are approximated by the passive parameters in the pre-layout verification 102A.

The exemplary integrated circuit design flow of FIG. 1 requires two schematic views, one each for the pre-layout verification step 102A and the post-layout verification step 102B, where the first schematic representation includes the passive parameters for pre-layout simulation at 108A, and a second schematic representation without the passive parameters for post-layout verification at 114B. Additionally, a lack of accounting for polarization in the LVS step 110B and manual blocking of layers within the RF or microwave devices within the layout view adds complexity to the circuit design flow 100.

Accordingly, the present disclosure relates to an apparatus and method to generate a device library, along with LVS and parasitic extraction set-up files for connecting with official tools of a design window supported by the PDK. In some embodiments, the device library comprises passive devices which can be utilized at any point in the end-to-end design flow from pre-layout verification to post-layout verification of an integrated circuit design. The device library allows for a single schematic view for pre-layout verification but also post-layout verification, thus allowing for pole or pin comparison, and prevents double-counting of parasitic effects from passive design elements by directly instantiating a device from the device library for a verification step. An LVS and parasitic extraction GUI Link allows for incorporation of the generated device library into a pre-existing PDK without any modification to the PDK. Other devices and methods are also disclosed.

Figure 3:
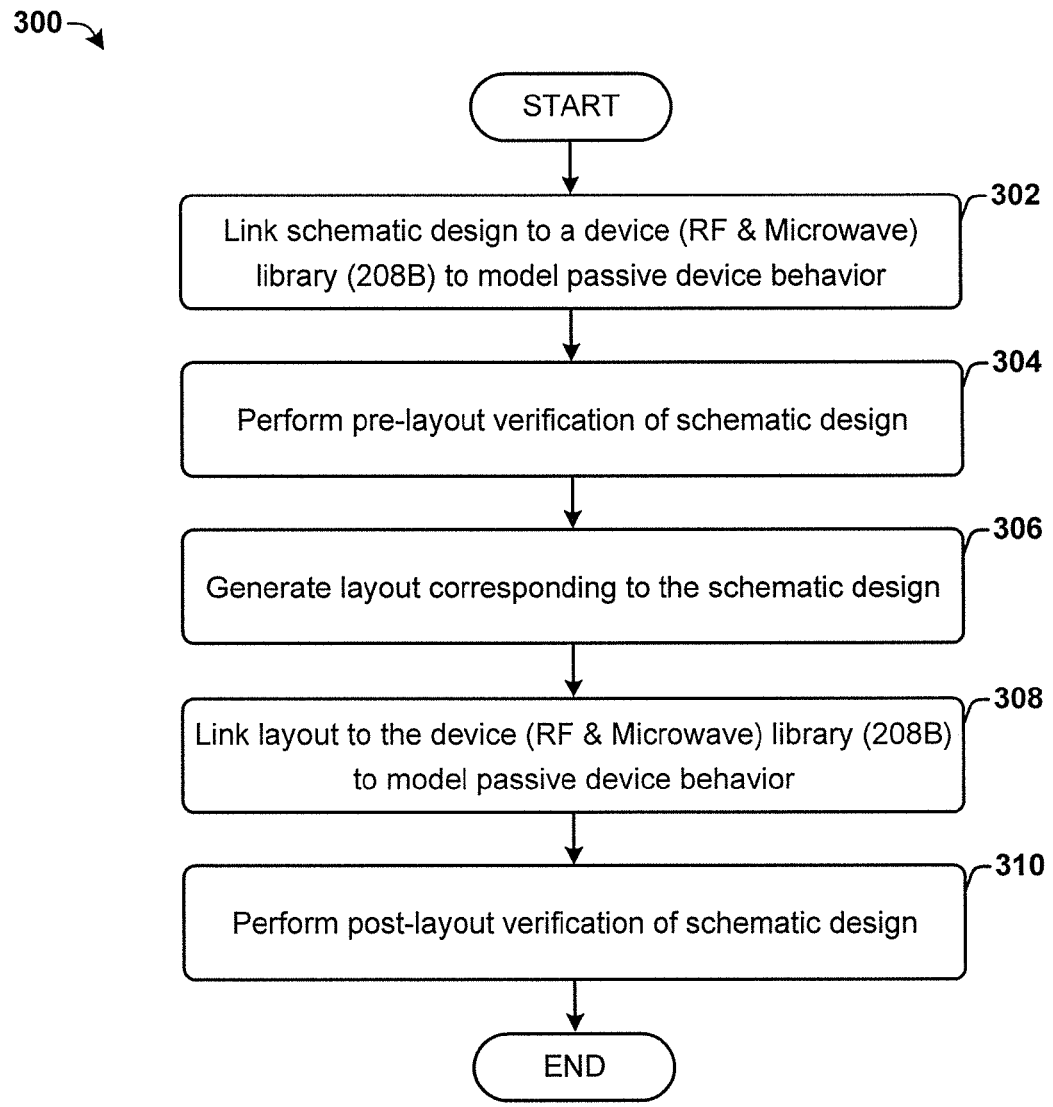
FIG. 3 illustrates some embodiments of a method to integrate a passive design into a design flow.

FIG. 2A illustrates an integrated circuit (IC) design flow 200A for passive device generation in accordance with various embodiments of the present disclosure. While method 200, and subsequently method 300 of FIG. 3 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202A a schematic representation of a circuit comprising active devices is generated. In some embodiments, generation of the schematic representation comprises utilization of a design tool such as a CADENCE VIRTUOSO or MENTOR GRAPHICS design window.

At 204A the schematic representation is linked to a passive library configured to store one or more passive device elements and associated parameters. A passive design element is instantiated from the passive library. A respective associated parameter of the passive device element is derived from physical layout topologies of a layout representation of the passive device element. For instance, a capacitance value of a metal-insulator-metal (MIM) capacitor is dependent upon an area of two or more metallization plates of the MIM capacitor and the distance between them. In some embodiments, the passive device element comprises an inductor, capacitor, or strip metal line parameterized cell (PCell) referenced from the passive library, where a functional parameter (i.e., S-parameter, Lump-Model, or polarization parameter) is assigned to the PCell in the schematic representation.

At 206A the schematic representation including the passive device element is formed.

At 208A a pre-layout simulation is performed to model the electrical behavior of the schematic representation including the passive device element with an industry-standard circuit simulation tool such as SPICE or SPECTRE. As part of the pre-layout simulation, a pre-layout netlist comprising an analogous definition of connectivity within the schematic representation is derived. In some embodiments, a subroutine embedded inside the pre-layout netlist references a path to the passive library. For instance, in SPECTRE a sub circuit or "subckt" command within pre-layout netlist references a file path to the passive design element.

At 210A the result of the pre-layout simulation is verified by a designer to insure a result that is consistent with expected functionality of the IC approximated by the schematic representation. If the result of the pre-layout simulation is not consistent, then the designer returns to 204A and revises functional parameters of the schematic representation or instantiates a new passive design element with a new functional parameter.

At 212A a layout representation is generated corresponding to the schematic representation, where generating the layout representation comprises converting the passive schematic design element into a passive layout design element through manual placement of physical design layers (i.e., polysilicon to form gates, metallization to form passive elements, etc.) or utilization of a parameterized cell (PCell) configured to generate all or a portion of the layout representation in accordance with the functional parameter.

At 214A LVS is performed to determine whether the layout representation of the IC corresponds to the schematic representation of the IC, where LVS comprises generating a post-layout netlist corresponding to the layout representation. The post-layout netlist comprises connections between active and passive circuit components within the layout representation. LVS compares the pre-layout netlist to the post-layout netlist to verify correspondence. In some embodiments, a subroutine embedded inside the post-layout netlist references a path to the passive library. For instance, in SPECTRE a sub circuit or "subckt" command within post-layout netlist references a file path to the passive layout design element.

At 216A parasitic extraction is performed in a parasitic extraction tool in order to compare the pre-layout netlist to the post-layout netlist to verify correspondence between respective functional parameters between the schematic representation and the layout representation.

At 218A a post-layout simulation is performed, comprising modeling properties of the circuit represented by the layout representation as a function of functional parameters and the post-layout netlist generated from the layout representation.

The IC design flow 200A utilizes a link to a schematic-to-layout device and model translator 200B to run through the IC design flow 200A successfully from pre-layout simulation to post-layout simulation without revising any files or decks inside original PDK. This is achieved by linking with parasitic-aware library 202B as illustrated by the schematic-to-layout device and model translator 200B in the embodiments of FIG. 2B. The parasitic-aware library 202B is configured to store network parameter data (i.e., an Nport symbol and schematic to support an S-parameter in an SnP file) comprising connectivity of a design element (e.g., a symbol design element, a schematic design element, and a layout design element corresponding to one another) and a functional parameter of the design element (i.e., a Lump-Model sub-circuit to support a netlist file). The schematic-to-layout device and model translator 200B further comprises a layout-effect repository 204B configured to store one or more layout topologies from which the functional parameter is derived, and a device generator 206B configured to receive inputs from the parasitic-aware library 202B and the layout-effect repository 204B and integrate the functional parameter into the design element to form an integrated design element. A device library 208B within a memory store is configured to receive the integrated design element from the device generator 206B and to store the integrated design element of the device library 208B for future use.

At 220A the result of the post-layout simulation is verified by a designer to insure a result that is consistent with expected functionality of the layout representation of the IC. If the result of the post-layout simulation is not consistent, then the designer returns to 204A and revises functional parameters of the schematic representation or re-instantiates the passive design element with a new functional parameter.

To access various components of the integrated design element from the device library 208B, the schematic-to-layout device and model translator 200B further comprises a layout versus schematic (LVS) set-up file 210B configured to add the integrated design element into the post-layout netlist (e.g., through a sub circuit command). A parasitic extraction set-up file 212B is configured to integrate extraction data, but without extracting the parasitic effects from the integrated design element within the layout representation into a parasitic extraction tool to prevent from double-counting of parasitic effects, and to link with the parasitic extraction set-up file 212B to assign the first functional parameter to the integrated design element within the post-layout netlist of the layout representation. In other words, the parasitic extraction set-up file 212B informs the parasitic extraction tool in action 216A not to extract parasitic effects from the integrated design element within layout representation to prevent from double counting parasitic effects, and instead to create the sub circuit with no contents in the post-layout netlist. The parasitic extraction tool accordingly assigns the first functional parameter inside the sub circuit within final layout representation of post-layout netlist. A post-layout verification link 214B is configured to receive inputs from the device library 208B, the LVS set-up file 210B, and the parasitic extraction set-up file 212B, and link to a LVS tool user interface or parasitic extraction tool user interface. Note that subcomponent 216B is independent of a PDK, and can generate an LVS set-up file 210B or a parasitic extraction set-up file 212B which is compatible with multiple tool formats.

To incorporate the passive layout design element into the layout representation for the purpose of LVS, the schematic-to-layout device and model translator 200B is utilized, where the schematic-to-layout device and model translator 200B is configured to receive inputs from the device library 208B and the LVS set-up file 210B. The LVS set-up file 210B is configured to translate the functional parameter into a format that is compatible with the post-layout netlist through a library initialization methodology, where the layout representation is built by referencing one or more design libraries including the passive device library at a specified time. To incorporate the functional parameter into the layout representation for the purpose of parasitic extraction, the post-layout verification link is also configured to receive inputs from a parasitic extraction set-up file. The parasitic extraction set-up file is configured to integrate the passive layout design element without extracting parasitic effects, and associated functional parameter derived by a parasitic extraction tool into a post-layout netlist corresponding to the layout representation 400E through a library initialization methodology.

FIG. 3 illustrates some embodiments of a method 300 to integrate a passive design into a design flow.

At 302 a schematic representation of a circuit is linked to a device library, the device library comprising a set of passive design elements and a first set of functional parameters corresponding to the set of passive design elements, where the set of passive design elements and first set of functional parameters are represented in a pre-layout simulation format, and where a passive schematic design element of the set of passive design elements is instantiated within the schematic representation. The schematic representation is generated by generating a schematic view of the circuit comprising the set of passive design elements and a set of active design elements, and generating a second set of functional parameters corresponding to the set of active design elements within the schematic representation. In some embodiments, linking the schematic representation to the device library comprises determining a location of the passive schematic element within the schematic view, instantiating the passive schematic design element at the location, and assigning the functional parameter to the passive schematic design element at the location within the schematic view.

At 304 a pre-layout simulation (e.g., a timing simulation of the circuit) is performed using an industry-standard simulation tool such as SPICE or SPECTRE, the pre-layout simulation comprising simulating function of the schematic representation with a first functional parameter from the first set of functional parameters assigned to the passive schematic design element. In some embodiments, the pre-layout simulation comprises generating a pre-layout netlist corresponding to the schematic representation, the pre-layout netlist comprising: connections within the set of passive design elements within the schematic view, connections within the set of active design elements within the schematic view, and connections between the set of active design elements and the set of passive design elements within the schematic view. The pre-layout simulation further comprises modeling properties of the circuit represented by the schematic representation as a function of the first set of functional parameters, the second set of functional parameters, and the pre-layout netlist.

At 306 a layout representation corresponding to the schematic representation of the circuit is generated. In some embodiments, generating the layout representation comprises generating a layout view of the circuit comprising the set of passive design elements and the set of active design elements, retaining the location of the passive schematic design element from the schematic view within the layout view, and retaining the second set of functional parameters in the layout view.

At 308 the layout representation is linked to a dynamic reference (i.e., the post-layout verification link 214B of the embodiments of FIG. 2B), the dynamic reference comprising a connection to the device library, and a connection to one or more set-up files configured to translate the first set of functional parameters from the pre-layout simulation format to a post-layout simulation format. A passive layout design element corresponding to the passive schematic design element is instantiated within the layout representation through the dynamic reference. In some embodiments, the one or more set-up files comprise a layout versus schematic (LVS) set-up file configured to integrate the passive layout element into a post-layout netlist corresponding to the layout representation. In some embodiments, the one or more set-up files comprise a parasitic extraction set-up file configured to integrate extraction data, but without extracting the parasitic effects from the set of passive design elements within the layout representation into a parasitic extraction tool to prevent from double-counting of parasitic effects. The parasitic extraction set-up file instead assigns the first set of functional parameters to the set of passive design elements within the post-layout netlist by creating a sub circuit with no contents in the post-layout netlist.

At 310 a post-layout simulation is performed comprising simulating function of the layout representation with the functional parameter assigned to the passive layout design element within the layout representation through the dynamic reference. In some embodiments, an LVS step is performed prior to the post-layout simulation, where the post-layout netlist corresponding to the layout representation is generated, the post-layout netlist comprising: connections within the set of passive design elements within the layout view, connections within the set of active design elements within the layout view, and connections between the set of passive design elements and the set of active design elements within the layout view. The LVS step further comprises comparing the pre-layout netlist to the post-layout netlist to verify correspondence between design components and connections between the schematic representation and the representation with the LVS tool. In some embodiments, a parasitic extraction step is performed after the LVS step and prior to the post-layout simulation. The parasitic extraction step comprises comparing the pre-layout netlist to the post-layout netlist to verify correspondence between respective functional parameters between the schematic representation and the layout representation with the parasitic extraction tool.

Figure 4A:
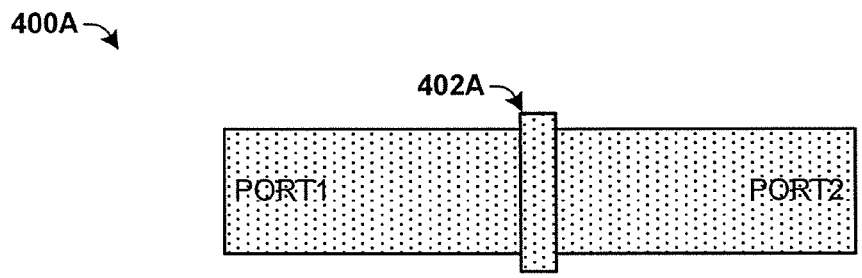
FIGS. 4A-4E illustrates some embodiments of design element and functional parameter assignment within a schematic view and within a layout view.

FIGS. 4A-4E illustrate some embodiments of design element and functional parameter assignment within a schematic view and within a layout view. FIG. 4A illustrates some embodiments of a layout view of a strip metal line 400A, the layout view comprising dimensional parameters of the strip metal line 400A (e.g., width, height, etc.), and in some instances proximity parameters (e.g., space to an adjacent feature) for the strip metal line 400A formed on a metallization layer (e.g., Cu, Al, etc.). The strip metal line 400A comprises a metallization "dummy" layer 402A in the center configured to divide a strip metal line 400A into two different ports of PORT1 and PORT2. Note that PORT1 or PORT2 must be surrounded by their related metallization layer with connectivity of PORT1 or PORT2 for recognition by auto place and route (APR) tool. FIG. 4A may be a parameterized cell or a fixed cell. The strip metal line 400A also comprises a passive schematic design element which may be instantiated from a passive library from which a functional parameter is derived. The functional parameter corresponds to a physical (i.e., electromagnetic) effect such as inductance, capacitance, etc, which is dependent upon a layout topology represented by the strip metal line 400A, and thus derived from the specific topology comprising the strip metal line 400A. In some embodiments, the functional parameter comprises an S-parameter or Lump-Model associated with the strip metal line 400A. S-parameters describe electrical properties such as gain, return loss, reflection coefficient, etc., associated with the strip metal line 400A and are convenient metrics for devices operating at RF and microwave-frequencies, where signal power and energy considerations are more easily quantified than currents and voltages. Lump-Models utilization in an integrated circuit (IC) makes the simplifying assumption that attributes of the IC: resistance, capacitance, inductance, and gain, are concentrated into idealized electrical components; resistors, capacitors, and inductors, etc. joined by a network of perfectly conducting wires (i.e., a Lump-Model represents the resistance of a wire as a resistor in a schematic view). In some embodiments, a layout view of an inductor allows for inclusion of a polarization parameter as the functional parameter, where the polarization parameter describes a direction of an electromagnetic field vector and associated electromotive force (EMF) resulting from current flow through the inductor, to account for the effect of the EMF on nearby objects in a layout representation.

Figure 4B:
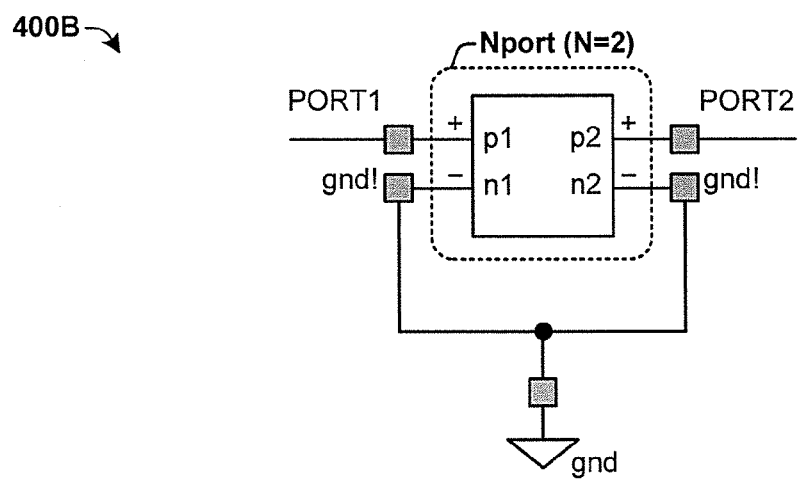
Figure 4C:
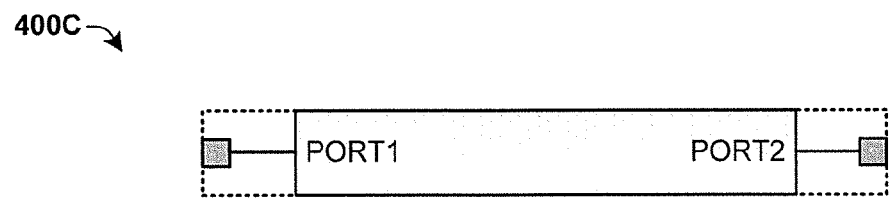

FIG. 4B illustrates some embodiments of a passive schematic design element 400B comprising a parameterized symbol (Nport) corresponding to the layout view of a strip metal line 400A of FIG. 4A, and comprising 2 ports (N=2), where a respective port is configured to make an external connection to the Nport through a respective port or "pin" (i.e., PORT1 or PORT2). The Nport symbol further comprises a variable parameter configured to match the functional parameter (e.g., assigning a resistance value). For the embodiments of FIGS. 4A-4E, a functional parameter comprising an S-parameter is assigned by instancing the Nport symbol from a parasitic-aware library though an SnP file (n=2), comprising an ASCII text file configured to transfer the S-parameter to the Nport symbol for retention within the schematic view. The SnP file also documents interior network parameter data for the Nport symbol comprising internal connections within the Nport symbol (e.g., for the embodiments of FIGS. 4A-4E PORT1 and PORT2 are connected to ports of "a" and "b", respectively). FIG. 4C illustrates some embodiments of a symbol view 400C created by retaining the functional parameter information from the passive schematic design element 400B of FIG. 4B. The symbol view 400C is stored in a device library for subsequent use.

Figure 4D:
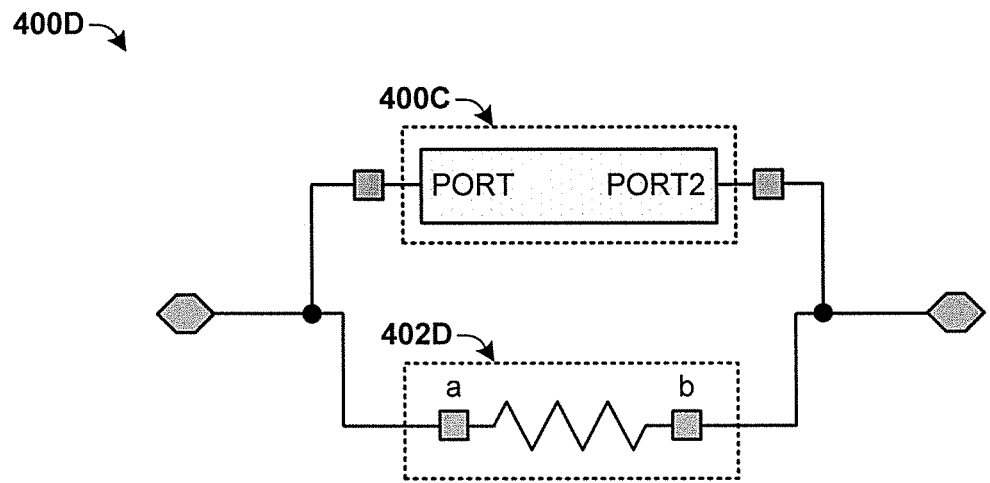
Figure 4E:
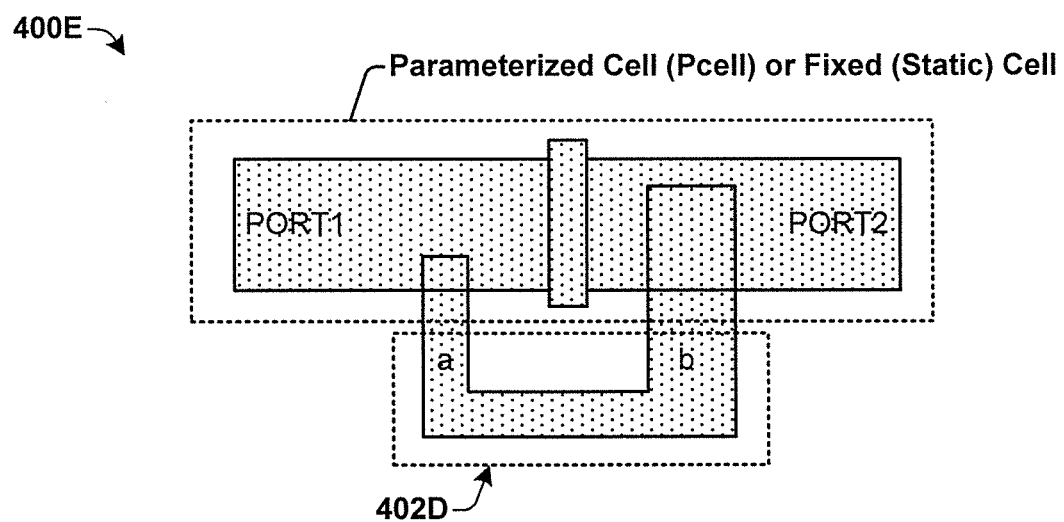

FIG. 4D illustrates some embodiments of a schematic representation 400D of a circuit, where the symbol view 400C has been instantiated from the device library and is configured in parallel with a resistor 402D. A pre-layout simulation of the schematic representation 400D is then accomplished with an industry-standard circuit simulation tool such as SPICE or SPECTRE, where the functional parameter comprising the S-parameter is incorporated into a pre-layout netlist from which the pre-layout simulation is performed. FIG. 4E illustrates some embodiments of a layout representation 400E of the circuit which is generated from the schematic representation 400D, where the strip metal line 400A comprises a parameterized cell (PCell) or a fixed cell, and where the S-parameter is converted into a format compatible to the layout representation 400E.

In some embodiments, conversion of the schematic representation 400D into the layout representation 400E comprises instantiating the strip metal line 400A PCell or fixed cell in the layout representation 400E and translating the S-parameter from the pre-layout simulation format to the post-layout simulation format with the one or more set-up files. In some embodiments, the one or more set-up files comprise an LVS set-up file configured to integrate the passive layout element into a post-layout netlist corresponding to the layout representation 400E though a library initialization methodology. In some embodiments, the one or more set-up files comprise a parasitic extraction set-up file configured suppress extraction of parasitic effects from the strip metal line 400A PCell or fixed cell within the layout representation to prevent from double-counting of parasitic effects. The parasitic extraction set-up file instead assigns the S-parameter to the set of passive design element to the strip metal line 400A within the post-layout netlist by creating a sub circuit with no contents in the post-layout netlist through a design vendor tools' application programming interface (API) and the parasitic extraction code.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, present disclosure relates to an apparatus and method to generate a device library, along with layout versus schematic (LVS) and parasitic extraction set-up files for connecting with official tools of a design window supported by a process design kit (PDK). The device library comprises passive devices which can be utilized at any point in an end-to-end design flow from pre-layout verification to post-layout verification of an integrated circuit design. The device library allows for a single schematic view for pre-layout verification but also post-layout verification, thus allowing for pole or pin comparison, and prevents double-counting of parasitic effects from passive design elements by directly instantiating a device from the device library for a verification step. An LVS and parasitic extraction graphical user interface (GUI) allows for incorporation of the generated device library into a pre-existing PDK without any modification to the PDK. Other devices and methods are also disclosed.

The passive device generation disclosed herein allows for pre-layout simulation and post-layout verification comprising LVS, parasitic extraction, and post-layout simulation with a single schematic view. This prevents double counting parasitic effects, and runs through an end-to-end circuit design flow without revising any files or decks inside original PDK by linking with the device (RF/Microwave) library to one of more set-up files with official tool of an LVS or extraction GUI automatically to reduce the effort of design flow implementation and cycle time. The passive device generation also maintains consistency between two schematic views, and eliminates additional layout steps to suppress double-counting of parasitic effects within the layout view.

In some embodiments, the present disclosure relates to a design flow, comprising generating a schematic representation of a circuit, and linking the schematic representation to a device library, the device library comprising a set of passive design elements and a first set of functional parameters corresponding to the set of passive design elements, wherein the set of passive design elements and first set of functional parameters are represented in a pre-layout simulation format. A passive schematic design element of the set of passive design elements is instantiated within the schematic representation, and a pre-layout simulation is performed comprising simulating function of the schematic representation with a first functional parameter from the first set of functional parameters assigned to the passive schematic design element. A layout representation corresponding to the schematic representation is generated, and linked to a dynamic reference. The dynamic reference comprises a connection to the device library, and a connection to one or more set-up files configured to translate the first set of functional parameters from the pre-layout simulation format to a post-layout simulation format. A passive layout design element of the set of passive design elements is instantiated within the layout representation, wherein the passive layout design element corresponds to the passive schematic design element. And, a post-layout simulation is performed comprising simulating function of the layout representation with the first functional parameter assigned to the passive layout design element within the layout representation through the dynamic reference.

In some embodiments, the present disclosure relates to a design flow for passive device generation, comprising generating a schematic representation of a circuit comprising active devices, instantiating a passive schematic design element from a passive library, and assigning a functional parameter to the passive schematic design element in the schematic representation, the functional parameter comprising an S-Parameter, Lump-Model, or a polarization parameter. The design flow for passive device generation next involves generating a layout representation corresponding to the schematic representation, wherein generating the layout representation comprises converting the passive schematic design element into a passive layout design element, converting the functional parameter into a format compatible to the layout representation, and assigning the functional parameter to the passive layout design element in the layout representation.

In some embodiments, the present disclosure relates to a schematic-to-layout device and model translator, comprising a parasitic-aware library configured to store network parameter data comprising connectivity of a design element and a functional parameter of the design element. The schematic-to-layout device and model translator further comprises a layout-effect repository configured to store one or more layout topologies from which the functional parameter is derived. A device generator within the schematic-to-layout device and model translator is configured to receive inputs from the parasitic-aware library and the layout-effect repository and integrate the first functional parameter into the design element to form an integrated design element. A device library is configured to receive the integrated design element from the device generator and to store the integrated design element. The schematic-to-layout device and model translator further comprises a layout versus schematic (LVS) set-up file configured receive the to add the integrated design element into the post-layout netlist comprising connectivity of a layout representation, and a parasitic extraction set-up file configured to suppress extraction of parasitic effects from the design element within the layout representation to prevent from double-counting of parasitic effects. The parasitic extraction set-up file instead assigns the first functional parameter of the design element within the post-layout netlist by creating a sub circuit with no contents in the post-layout netlist corresponding to the design element. A post-layout verification link within the schematic-to-layout device and model translator is configured to receive inputs from the device library, the LVS set-up file, and the parasitic extraction set-up file, and link to a LVS tool user interface or parasitic extraction tool user interface.

What is claimed is:

1. A method for passive device generation, comprising:
    generating a schematic representation of a circuit comprising active devices with a schematic design tool;
    instantiating a passive schematic design element from a passive library with the schematic design tool;
    assigning a functional parameter to the passive schematic design element in the schematic representation, the functional parameter comprising an S-Parameter, Lump-Model, or a polarization parameter;
    generating a layout representation corresponding to the schematic representation with a layout design tool, wherein generating the layout representation comprises converting the passive schematic design element into a passive layout design element;
    extracting first electrical properties of the layout representation with an extraction tool without extracting second electrical properties from the passive layout design element to create a post-layout netlist; and assigning the functional parameter to the passive layout design element in the post-layout netlist with a parasitic extraction set-up file coupled to the extraction tool.

2. The method of claim 1, wherein assigning the functional parameter to the passive schematic design element comprises:
retrieving a layout topology from a layout-effect repository configured to store one or more layout topologies within the layout design tool; and
deriving the functional parameter from the layout topology with a parasitic extraction tool.

3. The method of claim 2, wherein converting the functional parameter into a format compatible to the layout representation comprises:
translating the functional parameter into a format that is compatible with a post-layout netlist corresponding to the layout representation with a layout versus schematic (LVS) set-up file; and
integrating the functional parameter into the post-layout netlist at a location of the passive layout design element though a subroutine embedded inside the post-layout netlist which references a path to the passive library.

4. The method of claim 3, wherein converting the functional parameter into a format compatible to the layout representation comprises:
translating the functional parameter into a format that is compatible with a parasitic extraction result corresponding to the layout representation;
integrating the functional parameter into the parasitic extraction result; and
assigning the functional parameter to the passive layout element within the post-layout netlist though a subroutine embedded inside the post-layout netlist which references a path to the passive library.

5. A schematic-to-layout device and model translator, comprising:
a parasitic-aware library configured to store network parameter data comprising connectivity of a design element and a functional parameter of the design element;
a layout-effect repository configured to store one or more layout topologies from which the functional parameter is derived;
a device generator configured to receive inputs from the parasitic-aware library and the layout-effect repository and integrate the functional parameter into the design element to form an integrated design element; and
a device library configured to receive the integrated design element from the device generator and to store the integrated design element;
wherein the functional parameter comprises a connection formed to the integrated design element, a parasitic layout effect resulting from the one or more layout topologies, or a polarization within the integrated design element.

6. The schematic-to-layout device and model translator of claim 5, wherein the integrated design element comprises a schematic design element view further comprising:
a port configured to make an external connection to the schematic design element;
an interior network comprising internal connections within the schematic design element; and
a variable parameter configured to match the functional parameter.

7. The schematic-to-layout device and model translator of claim 5, wherein the integrated design element comprises a layout design element further comprising a port configured to make an external connection to the layout design element.

8. The schematic-to-layout device and model translator of claim 5, further comprising:
a layout versus schematic (LVS) set-up file configured receive the to add the integrated design element into a post-layout netlist comprising connectivity of a layout representation;
a parasitic extraction set-up file configured to suppress extraction of the functional parameter by a parasitic extraction tool, and instead to assign the functional parameter to the design element in the post-layout netlist; and
a post-layout verification link configured to receive inputs from the device library, the LVS set-up file, and the parasitic extraction set-up file, and link to a LVS tool user interface or parasitic extraction tool user interface.

9. A method for passive device generation, comprising:
generating a schematic representation of a circuit comprising active devices with a schematic design tool;
instantiating a passive schematic device from a passive library in the schematic representation with the schematic design tool;
assigning a passive electrical parameter from the passive library to the passive schematic device;
generating a layout representation corresponding to the schematic representation with a layout design tool, wherein generating the layout representation comprises converting the passive schematic device into a passive layout device;
extracting active electrical parameters from the layout representation with an extraction tool without extracting the passive electrical parameter from the passive layout device to create a post-layout netlist; and
assigning the passive electrical parameter from the passive library to the passive layout device in the post-layout netlist.

10. The method of claim 9, wherein the post-layout netlist comprises connections formed between the active devices and the passive layout device within the layout representation.

11. The method of claim 10, further comprising:
before generating the layout representation, creating a pre-layout netlist comprising connections formed between the active devices and the passive schematic device within the schematic representation;
performing a pre-layout simulation to model function of the schematic representation with the passive electrical parameter assigned to the passive schematic device using the pre-layout netlist to define the connections formed within the schematic representation;
performing a post-layout simulation using the post-layout netlist to define the connections formed within the layout representation; and
verifying correspondence between the pre-layout simulation and the post-layout simulation.

12. The method of claim 9, wherein assigning the passive electrical parameter from the library comprises:
determining a location of the passive schematic device within the schematic representation;
instantiating the passive schematic device at the location; and
assigning the passive electrical parameter to the passive schematic device at the location.

13. The method of claim 12, wherein generating the layout representation comprises:

retaining connections between the active devices from the schematic representation;

retaining connections between the active devices and the passive schematic device from the schematic representation; and retaining active electrical parameters of the active devices from the schematic representation.

14. The method of claim 13, further comprising instantiating the passive layout device from the location of the passive schematic device within the schematic representation;

translating the passive electrical parameter from a pre-layout simulation format to a post-layout simulation format with a set-up file configured to integrate the passive layout device into a post-layout netlist; and assigning the passive electrical parameter to the passive layout device at the location within the post-layout netlist.

15. The method of claim 9, wherein the passive electrical parameter comprises a capacitance or inductance of the passive schematic device or the passive layout device.

* * * * *